US007000139B2

United States Patent
Araki

(10) Patent No.: US 7,000,139 B2
(45) Date of Patent: Feb. 14, 2006

(54) INTERFACE CIRCUIT FOR SELECTIVELY LATCHING BETWEEN DIFFERENT SETS OF ADDRESS AND DATA REGISTERS BASED ON THE TRANSITIONS OF A FREQUENCY-DIVIDED CLOCK

(75) Inventor: Satoru Araki, Fukuoka (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 520 days.

(21) Appl. No.: 10/229,173

(22) Filed: Aug. 28, 2002

(65) Prior Publication Data

US 2003/0042956 A1    Mar. 6, 2003

(30) Foreign Application Priority Data

Aug. 29, 2001  (JP)  ............................. 2001-259243

(51) Int. Cl.
*G06F 1/04*    (2006.01)
(52) U.S. Cl. .................. 713/600; 711/104; 365/189.01
(58) Field of Classification Search ..................... None
See application file for complete search history.

(56) References Cited

U.S. PATENT DOCUMENTS

| 4,298,954 | A | * | 11/1981 | Bigelow et al. ............... 710/53 |
| 5,926,475 | A | * | 7/1999 | Saldinger et al. ........... 370/394 |
| 6,724,686 | B2 | * | 4/2004 | Ooishi et al. ................ 365/233 |
| 6,754,740 | B2 | * | 6/2004 | Happonen .................... 710/52 |
| 6,801,979 | B1 | * | 10/2004 | Estakhri ........................ 711/5 |

* cited by examiner

Primary Examiner—Lynne H. Browne
Assistant Examiner—Anand B. Patel
(74) Attorney, Agent, or Firm—Volentine Francos & Whitt, PLLC

(57) ABSTRACT

An interface circuit includes a frequency divider which divides a frequency of a base clock to provide frequency-divided clock signals; a first address register which stores an address signal at a timing in which the frequency-divided clock signal is turned to high; a second address register which stores the address signal at a timing in which the clock signal is turned to low; a first data register which stores a data signal at a timing in which the clock signal is turned to high; and a second data register which stores the data signal at a timing in which the clock signal is turned to low. The data signals stored in the first and second data registers are selectively outputted.

5 Claims, 7 Drawing Sheets

INTERFACE CIRCUIT FOR SELECTIVELY LATCHING BETWEEN DIFFERENT SETS OF ADDRESS AND DATA REGISTERS BASED ON THE TRANSITIONS OF A FREQUENCY-DIVIDED CLOCK

CROSS REFERENCE TO RELATED APPLICATION

This application claims the priority of Application No. 2001-259243, filed Aug. 29, 2001 in Japan, the subject matter of which is incorporated herein by reference.

TECHNICAL FIELD OF THE INVENTION

This invention relates to an interface circuit coupled between a control device, such as a microprocessor (CPU) and a digital signal processor (DSP), and a controlled device, such as a LSI.

BACKGROUND OF THE INVENTION

FIG. 1 shows a conventional system. This system includes a DSP 1, a LSI 2 and a frequency dividing circuit 3. The DSP 1 and the LSI 2 are connected through an address bus 4, a data bus 5 and a control bus 6.

The address bus 4 is used for transmitting an address signal AD from the DSP 1 to the LSI 2. The data bus 5 is used to transmit writing data from the DSP 1 to the LSI 2. The control bus 6 is used to transmit a writing control signal /WE and a reading control signal /RE from the DSP 1 to the LSI 2. The writing control signal /WE instructs data-writing operation, in which "/" means that the signal is active at a low level "L". The reading control signal /RE instructs data-reading operation.

The frequency dividing circuit 3 divides a clock signal CLK, supplied from the DSP 1 by N to supply a frequency-divided clock signal CK signal to the LSI 2. Generally, the DSP 1 has a higher performance and the clock signal CLK has a frequency of higher than several 100 MHz. On the other hand, the LSI 2 operates a lower speed and could not operate based on the high frequency clock signal CLK. For that reason, the frequency of the clock signal CLK is divided by the frequency dividing circuit 3 to provide a low frequency clock signal CK, to be supplied to the LSI 2.

FIG. 2 is a timing chart showing writing and reading operations of the system shown in FIG. 1. The frequency dividing circuit 3 divides the clock signal CLK by four (dividing ratio N=4).

A clock signal CLK outputted from the DSP 1 is divided in frequency by four at the frequency dividing circuit 3 to provide a frequency-divided clock signal CK. Four of frequency-divided clock signals CK1, CK2, CK3 and CK4, having different phases, are selectively used.

For writing data DT supplied from the DSP 1 into the LSI 2, an address signal AD is supplied from the DSP 1 to the address bus 4 at a timing of t1 in FIG. 2, in which the clock signal CLK is turned to high or rising up. At a timing t2, in which the clock signal CLK is turned to high, the data DT to be written are supplied to the data bus 5. And at the same time, a low level "L" of the writing control signal /WE is supplied to the control bus 6.

After the writing control signal /WE is turned to low "L", the data DT on the data bus 5 are supplied to the LSI 2 at a first rising point of the frequency-divided clock signal CK, supplied from the frequency dividing circuit 3.

As described above, the frequency dividing circuit 3 supplies one of four frequency-divided clock signals CK1–CK4. However, it is not known which one of the clock signals CK1–CK4 is actually supplied to the LSI 2. Therefore, the data DT can be written into the LSI at a timing of t3, t4, t5 or t6. At the latest timing of t6, the writing control signal /WE is turned to high "H".

After that, at a timing t7 in which the clock signal CLK is turned to high, both the address signal AD and data DT are stopped being supplied. For reading data DT from the LSI 2, an address signal AD is supplied to the address bus 4 at a timing t11, in which the clock signal CLK is turned to high. At a timing t12, in which the clock signal CLK is turned to high, a reading control signal /RE is supplied to the control bus 6.

On the other hand, after the writing control signal /WE, supplied from the DSP 1, is turned to low "L", the data DT on the data bus 5 is supplied to the LSI 2 at a timing in which the frequency-divided clock signal CK is turned to high.

As described above, it is not known which one of the clock signals CK1–CK4 is actually supplied to the LSI 2. Therefore, the data DT can be written into the LSI at a timing of t3, t4, t5 or t6. At the latest timing of t6, the writing control signal /WE is turned to high "H".

At a timing "t7", in which the clock signal CLK is turned to high "H", both of the address signal AD and the data DT are stopped being supplied. For reading data DT from LSI 2, an address signal AD is supplied from the DSP 1 to the address bus 4 at a timing "t11" shown in FIG. 2 in which the clock signal CLK is turned to high "H". At the next rising point of the clock signal CLK at a timing "t12", a low level "L" of a reading control signal /RE is supplied to the control bus 6.

On the other hand, after the reading control signal /RE, supplied from the DSP 1, is turned to low "L", the data DT designated by the address signal AD is supplied onto the data bus 5 at a timing in which the frequency-divided clock signal CK is turned to high "H". It is not known which one of the clock signals CK1–CK4 is actually supplied to the LSI 2. Therefore, the data DT can be supplied on to the data bus 5 at a timing of one of "t13," "t14," "t15" and "t16". At the latest timing of "t16", the reading control signal /RE is turned to high "H".

At a timing "t17", in which the clock signal CLK is turned to high "H", the address signal AD is stopped being supplied.

However, according to the above described conventional system, the following disadvantages arise:

The frequency dividing circuit 3 produces N (four) different phases of frequency-divided clock signal CKi, and it is not known which one of them is to be actually used at the DSP 1 side. Therefore, in order to read and write data DT, it is required to use the latest timing clock.

As a result, in the case where the frequency dividing circuit 3 divides a frequency of the base clock CLK by "N", "N+1" clocks would be required to perform each reading and writing operation. For example, for the dividing ratio N=16, seventeen clocks are required to perform each reading and writing operation. Such adjustment of timing is carried out at the DSP 1 by program-controlling timings of supplying the reading control signal /RE and the writing control signal /WE, that is a waiting time. However, according to an ordinary DSP, the maximum period of time that can be controlled by a program is limited. Therefore, if a frequency dividing circuit 3 has a large dividing ratio, reading and writing operations could not be carried out.

OBJECTS OF THE INVENTION

Accordingly, an object of the present invention is to provide an interface circuit, in which a waiting time for reading and writing operation can be shortened.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, an interface circuit includes a frequency divider which divides a frequency of a base clock to provide frequency-divided clock signals; a first address register which stores an address signal at a timing in which the frequency-divided clock signal is turned to high; a second address register which stores the address signal at a timing in which the clock signal is turned to low; a first data register which stores a data signal at a timing in which the clock signal is turned to high; and a second data register which stores the data signal at a timing in which the clock signal is turned to low. The data signals stored in the first and second data registers are selectively outputted.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
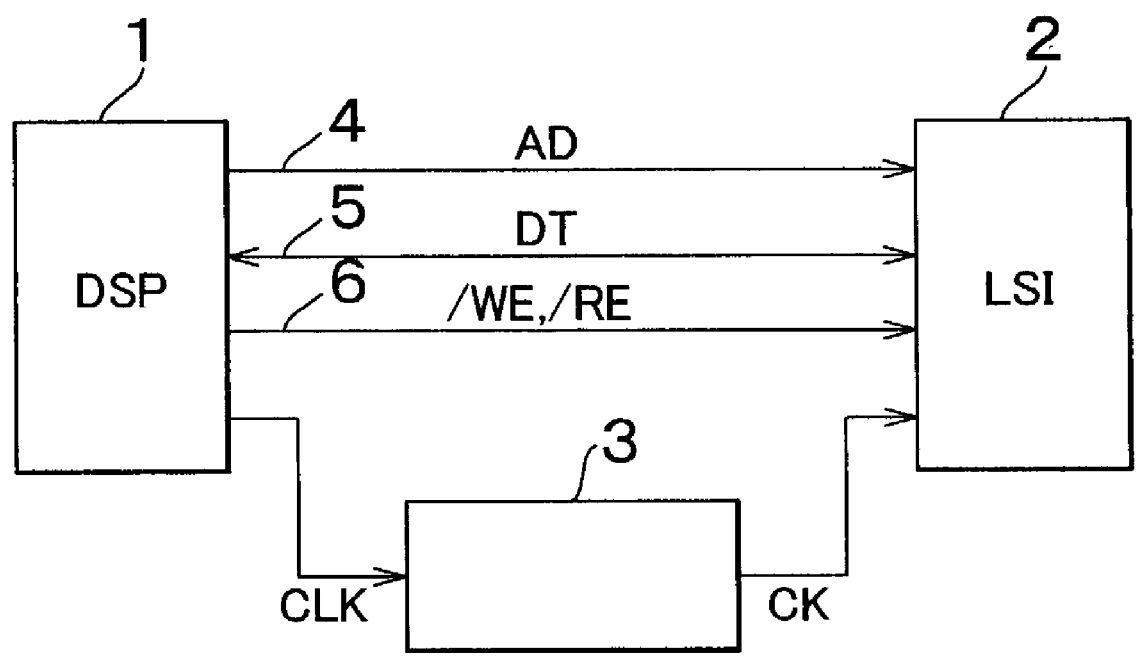
FIG. 1 is a block diagram showing a conventional system.
Figure 2:
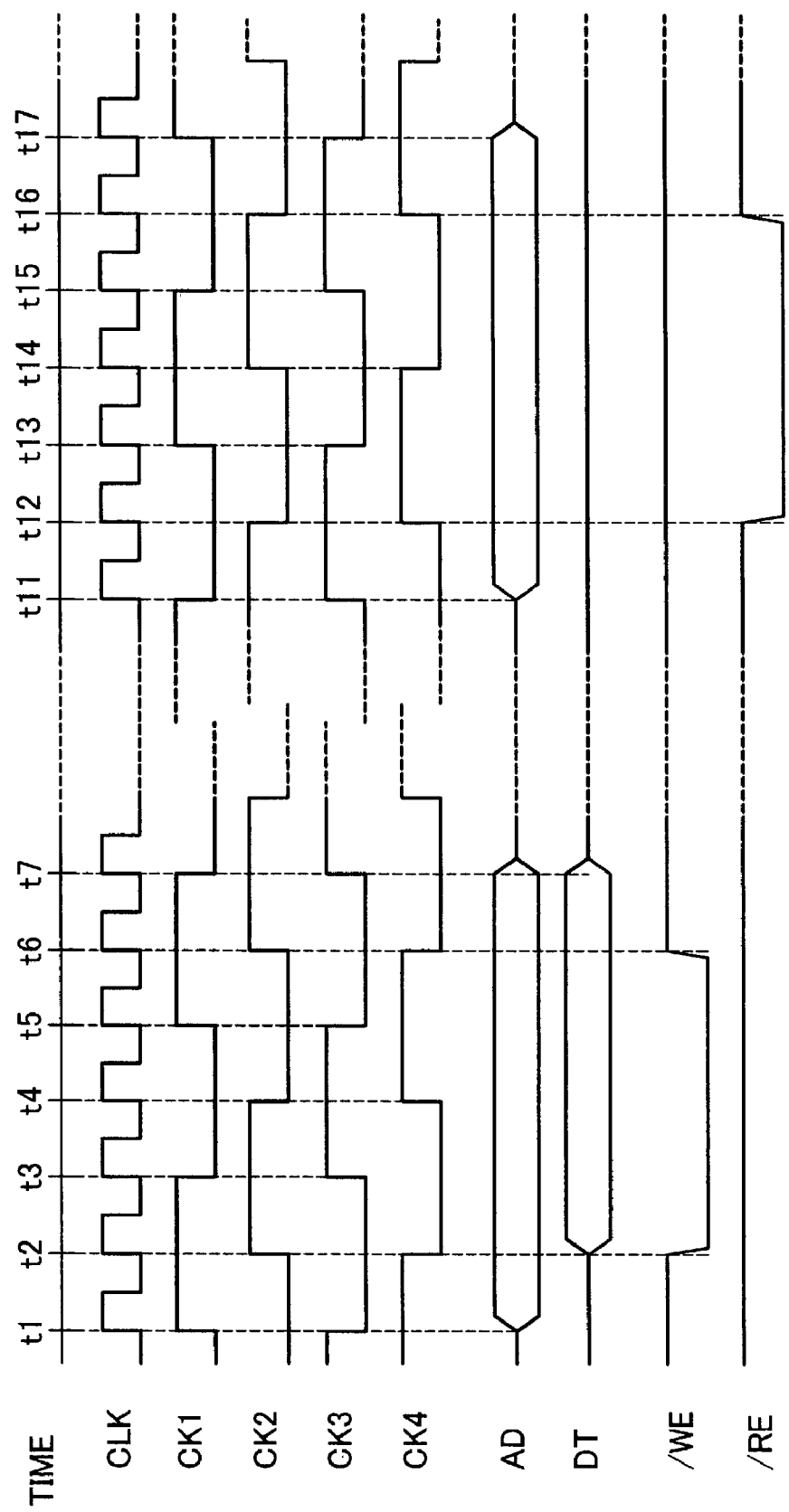
FIG. 2 is a timing chart showing the operation of the conventional system, shown in FIG. 1.
Figure 3:
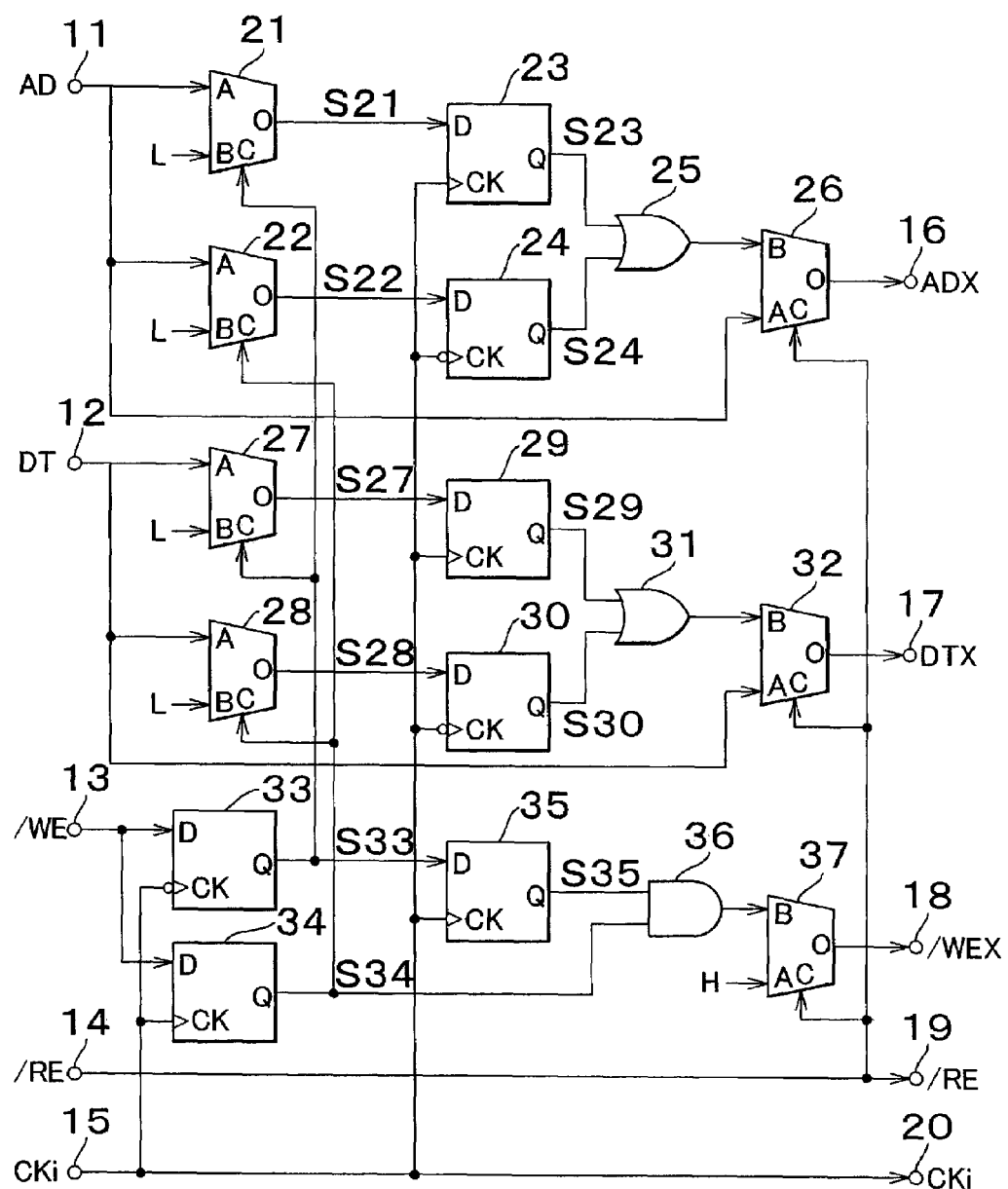
FIG. 3 is a block diagram showing an interface circuit according to the present invention.

FIG. 3 shows an interface circuit according to the present invention. The interface circuit includes input terminals 11–15 to which signals are supplied from a control device, such as a CPU and a DSP. The interface circuit also includes output terminals 16–20 coupled to a device to be controlled by the control device, such as an LSI.

The input terminals 11–14 are supplied with an address signal AD, data DT, a writing control signal /WE and a reading control signal /RE, respectively. The other input terminal 15 is supplied with a frequency-divided clock signal CKi (i=1 to 4), which is generated by dividing a base clock signal CLK at a frequency dividing circuit (3). In this embodiment, the dividing ratio "N" is four.

The input terminal 11 is connected to input terminals of selectors 21 and 22. Another input terminals of the selectors 21 and 22 are supplied with a fixed signal of low level "L". The selector 21 includes an output terminal "O" from which a signal S21 is supplied to an input terminal "D" of a register 23. The selector 22 includes an output terminal "O" from which a signal S22 is supplied to an input terminal "D" of a register 24.

The register 23 includes an output terminal Q supplying a signal S23 to an input terminal of an OR gate 25. The register 24 includes an output terminal Q supplying a signal S24 to another input terminal of the OR gate 25. An output terminal of the OR gate 25 is connected to an input terminal B of a selector 26. The selector 26 includes another input terminal "A" which is connected to the address input terminal 11. An output terminal of the selector 26 is connected to the output terminal 16. An address signal ADX is supplied from the output terminal 16 to the controlled device.

The input terminal 12 is connected to input terminals "A" of selectors 27 and 28. Another input terminals "B" of the selectors 27 and 28 are supplied with a fixed signal having a low level "L". The selector 27 includes an output terminal "O" from which a signal S27 is supplied to an input terminal "D" of a register 29. The selector 28 includes an output terminal "O" from which a signal S28 is supplied to an input terminal "D" of a register 30.

Output terminals "Q" of the registers 29 and 30 respectively supply signals S29 and S30 to input terminals of an OR gate 31. An output terminal of the OR gate 31 is connected to an input terminal "B" of a selector 32. Another input terminal of the selector 32 is connected to the input terminal 12. An output terminal "O" of the selector 32 is connected to the output terminal 17, from which data DTX are supplied to the controlled device.

The input terminal 13 is connected to input terminals of registers 33 and 34. An output terminal "Q" of the register 33 supplies S33 to an input terminal "D" of a register 35 and to control terminals "C" of the selectors 21 and 27. An output terminal "Q" of the register 34 supplies S34 to an input terminal of an AND gate 36 and to control terminals "C" of the selectors 22 and 28.

The register 35 includes an output terminal "Q" from which a signal S35 is supplied to another input terminal of the AND gate 36. An output terminal of the AND gate 36 is connected to an input terminal "B" of a selector 37. The selector 37 includes an input terminal "A" to which a fixed high-level signal "H" is supplied. An output terminal of the selector 37 is connected to an output terminal 18, from which a writing control signal /WEX is supplied to the controlled device.

The input terminal 14 is connected to control terminals "C" of the selectors 26, 32 and 37 and to the output terminal 19. A reading control signal /RE is directly transmitted from the control device to the controlled device.

The input terminal 15 is connected to clock terminals "CK" of the selectors 23, 24, 29, 30 and 33-35 and to the output terminal 20. A frequency divided clock signal CKi is directly transmitted from the control device to the controlled device.

In each of the selectors 21, 22, 26–28, 32 and 37, the input terminal "A" is connected to the output terminal "O", when a low level signal "L" is supplied to the control terminal "C". On the other hand, in each of the selectors 21, 22, 26–28, 32 and 37, the input terminal "B" is connected to the output terminal "O", when a high level signal "H" is supplied to the control terminal "C".

Each of the registers 23, 29, 34 and 35 stores a signal supplied to the input terminal "D" at a timing in which the frequency-divided clock signal CKi is turned to high, and supplies the stored signal to the output terminal "Q". On the other hand, each of the registers 24, 30 and 33 stores a signal supplied to the input terminal "D" at a timing in which the frequency-divided clock signal CKi is turned to low, and supplies the stored signal to the output terminal "Q".

Although, each of the address signal AD and data DT is shown as a single line, each signal includes a plurality of bits; and therefore, all the selectors, registers and gate circuits are designed to be able to operate for multi-bit signals.

FIGS. 4–7 are timing charts showing the writing operation of the interface circuit, shown in FIG. 3. In this embodiment, frequency-divided clock signals CKi (i=1 to 4), are generated by dividing a base clock CLK at a frequency dividing with a dividing ratio N(=4). FIGS. 4–7 shows the operations in accordance with different phases of clock signals CK1, CK2, CK3 and CK4.

Figure 4:
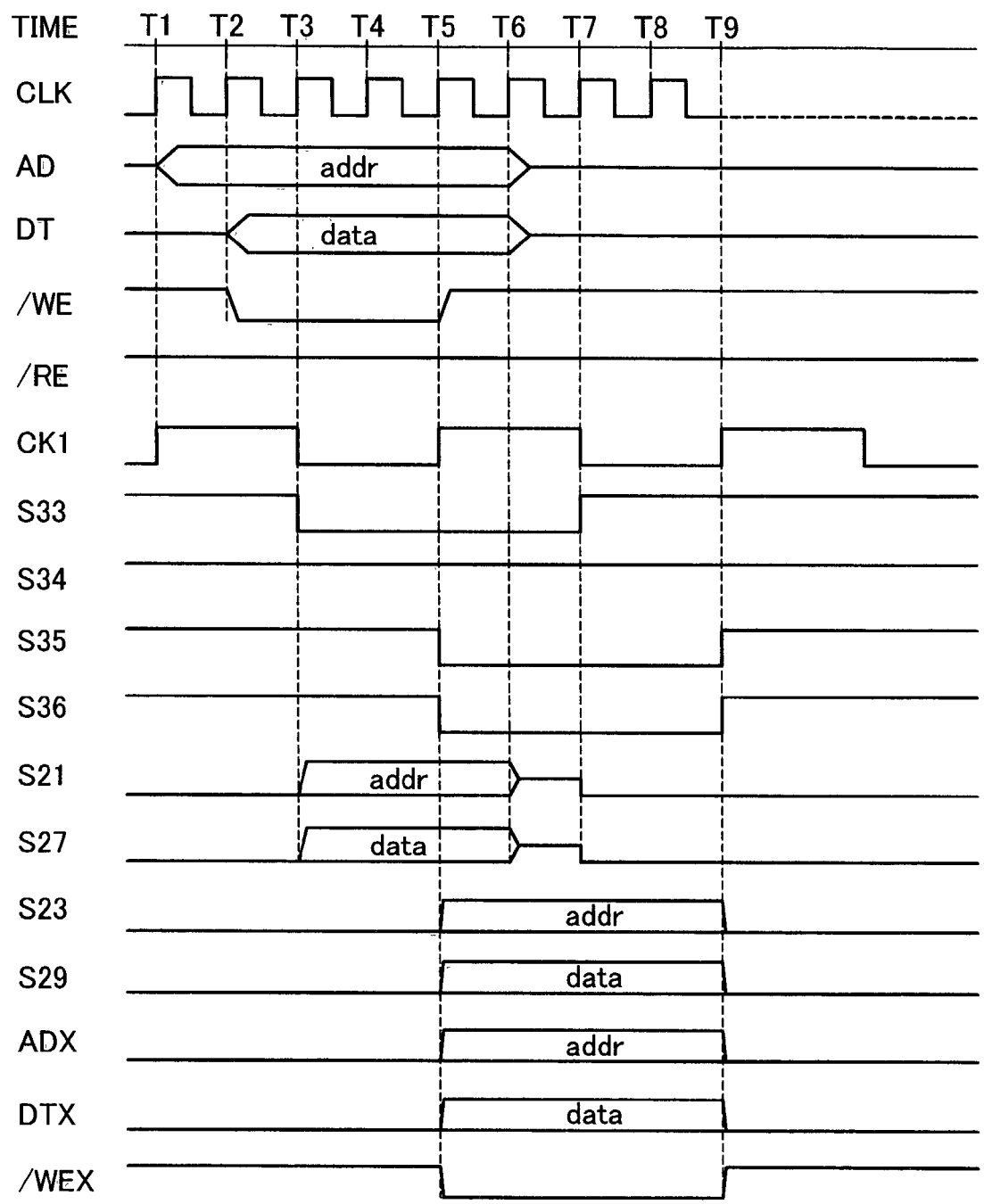
FIGS. 4–7 are timing charts showing the operation of the interface circuit, shown in FIG. 3.

As shown in FIG. 4, an address signal AD ("addr") is supplied to the input terminal 11 at a timing "T1" where the base clock CLK is turned to high. At a timing "T2" in which the clock signal CLK is subsequently turned to high, a data signal DT ("data") is supplied to the input terminal 12. At the same time, a writing control signal /WE is turned to low "L" to indicate or instruct a writing operation.

At timings "T3" and "T4" where the clock signal CLK is turned to high, none of the address signal AD, data signal DT and the writing control signal /WE is changed in state.

At a timing "T5" where the clock signal CLK is turned to high, the writing control signal /WE is turned to high "H" to cancel a writing operation. One clock later at a timing "T6" where the clock signal CLK is turned to high, the address signal AD and data signal DT are cancelled. For that period of time, a reading control signal /RE is maintained at "H". As a result, the selectors 26, 32 and 37 select input terminals "B" for operation.

A frequency-divided clock signal CK1, supplied to the input terminal 15, is turned to high at timing "T1". At that time, the writing control signal /WE is still at high "H", therefore, all the signals S33, S34 and S35 are at high "H" in level. The selectors 21, 22, 27 and 28 selectively connect the input terminals "B" to the output terminals "O". All the signals S23, S24, S29 and S30 stored in the registers 23, 24, 29 and 30 are at a low level "L". Therefore, both of the address signal ADX and data signal DTX, outputted from the output terminals 16 and 17 are at a low level "L", which a writing control signal /WEX is at a high level "H".

At a timing "T3" in which the frequency-divided clock signal CK1 is turned to low, the writing control signal /WE is at a low level "L". The signal S33 supplied from the register 33 is turned to low "L". Each of the selectors 21 and 27 selectively connect the input terminal "A" to the output terminal "O", so that address signal "addr" and data signal "data" are outputted as the signals S21 and S27, respectively.

At a timing "T5" where the frequency-divided clock signal CK1 is turned to high, signals S21 and S27 supplied from the selectors 21 and 27 are stored in the registers 23 and 29, respectively. Address signal "addr" and data signal "data" are outputted as the signals S23 and S29, respectively. A signal S33 supplied from the register 33 is stored in the register 35. The register 35 outputs a signal S35 at a low level "L". The output terminals 16 and 17 supply address signal ADX of "addr" and data signal DTX of "data", respectively. The output terminal 18 outputs a writing control signal /WE at a low level "L"

At timing "T6", the address signal AD and data signal DT are cancelled, however, the frequency-divided clock signal CK1 is maintained at "H", therefore, signals outputted form the output terminals 16–18 are not changed.

At a timing "T7" where the frequency-divided clock signal CK1 is turned to low, the writing control signal /WE is at a high level "H". A signal S33 supplied from the register 33 turned to high "H". Each of the selectors 21 and 27 connects the input terminal B to the output terminal "O". The selectors 21 and 27 output low level signals S21 and S27, respectively.

At a timing "T9" where the frequency-divided clock signal CK1 is turned to high (rising up), the output signals S21 and S27 supplied from the selectors 21 and 27 are stored in the registers 23 and 29, respectively. The registers 23 and 29 supplies output signals of S23 and S29 of low level "L". A signal S33 supplied from the register 33 is stored in the register 35, which outputs a signal S35 of high level "H". The output terminals 16 and 17 output low level signals "L" as the address signal ADX and data signal DTX, respectively. The output terminal 18 supplies a writing control signal /WEX of high level "H".

Figure 5:
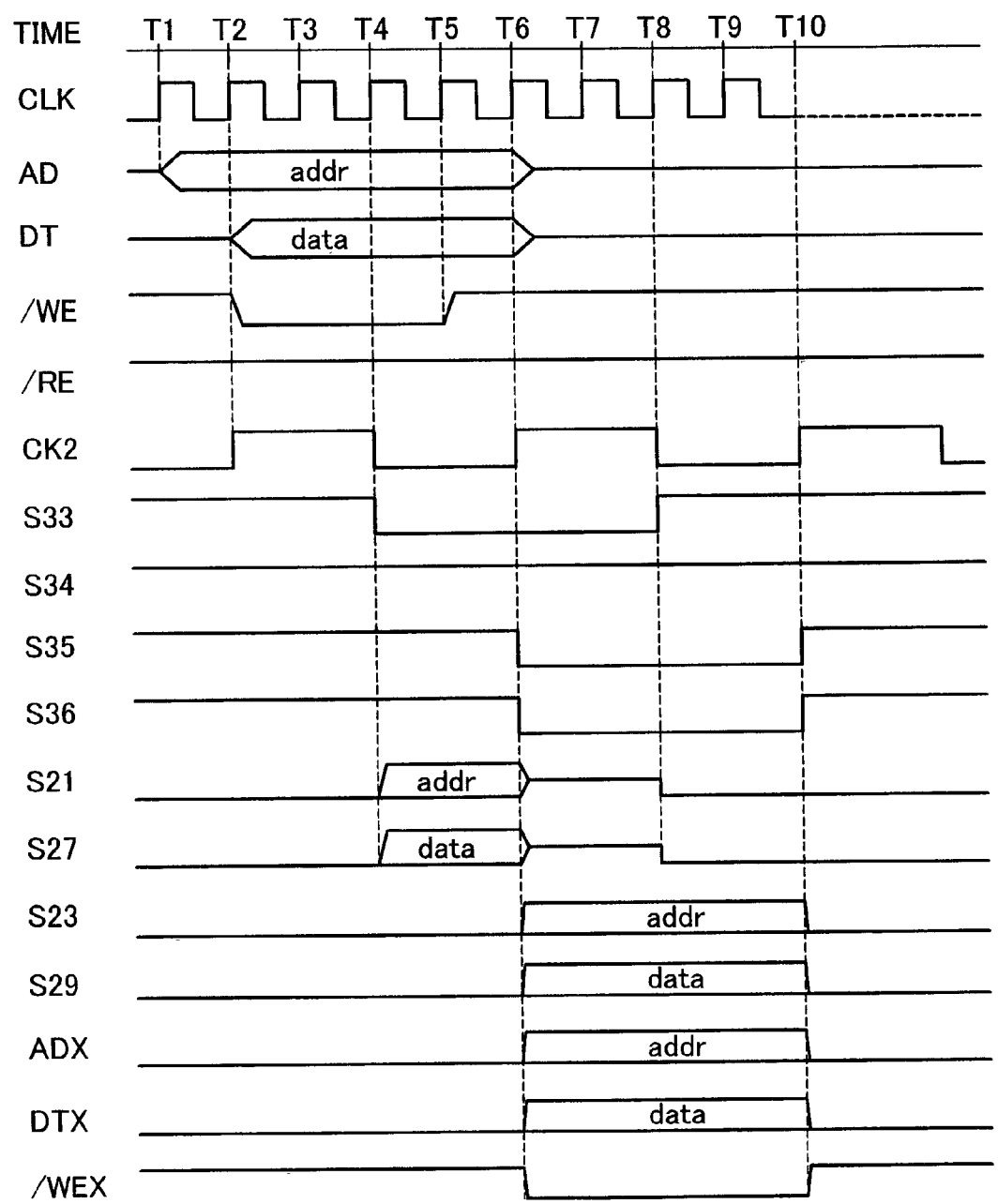

FIG. 5 is a timing chart showing the operation of the interface circuit in accordance with a frequency-divided clock signal CK2, which is turned to high at a timing of "T2". Operational timings of input signals AD, DT, /WE and /RE supplied to the input terminals 11 to 14 are the same as the above described case, shown in FIG. 4.

In the case of FIG. 5, using the frequency-divided clock signal CK2, a signal S33 supplied from the register 33 is turned to low "L" at a timing "T4" where the frequency-divided clock signal CK2 is turned to low. Each of the selectors 21 and 27 selects and connects the input terminal "A" to the output terminal "O". The selectors 21 and 27 output signals S21 and S27 as address signal "addr" and data signal "data", respectively.

At a timing "T6" in which the frequency-divided clock signal CK2 is turned to high, signals S21 and S27 supplied from the selectors 21 and 27 are stored in the registers 23 and 29, respectively. The registers 23 and 29 output an address signal "addr" and a data signal "data" as signals S23 and S29, respectively. A signal S33 supplied from the register 33 is stored in the register 35, which supplies an output signal S35 of low level "L". The output terminals 16 and 17 output signals "addr" and "data" as address signal ADX and data signal DTX, respectively. The output terminal 18 outputs a writing control signal /WEX at a low level "L".

At a timing "T8" in which the frequency-divided clock signal CK2 is turned to low, a signal S33 supplied from the register 33 is turned to high "H". Each of the selectors 21 and 27 selects and connects the input terminal "B" to the output terminal "O", so that the selectors 21 and 27 output signals S21 and S27 at a low level "L".

At a timing "T10" where the frequency-divided clock signal CK2 is turned to high (rising up), the output signals S21 and S27 supplied from the selectors 21 and 27 are stored in the registers 23 and 29, respectively. The registers 23 and 29 supplies output signals of S23 and S29 of low level "L". A signal S33 supplied from the register 33 is stored in the register 35, which outputs a signal S35 of high level "H". The output terminals 16 and 17 output low level signals "L" as the address signal ADX and data signal DTX, respectively. The output terminal 18 supplies a writing control signal /WEX of high level "H".

Figure 6:
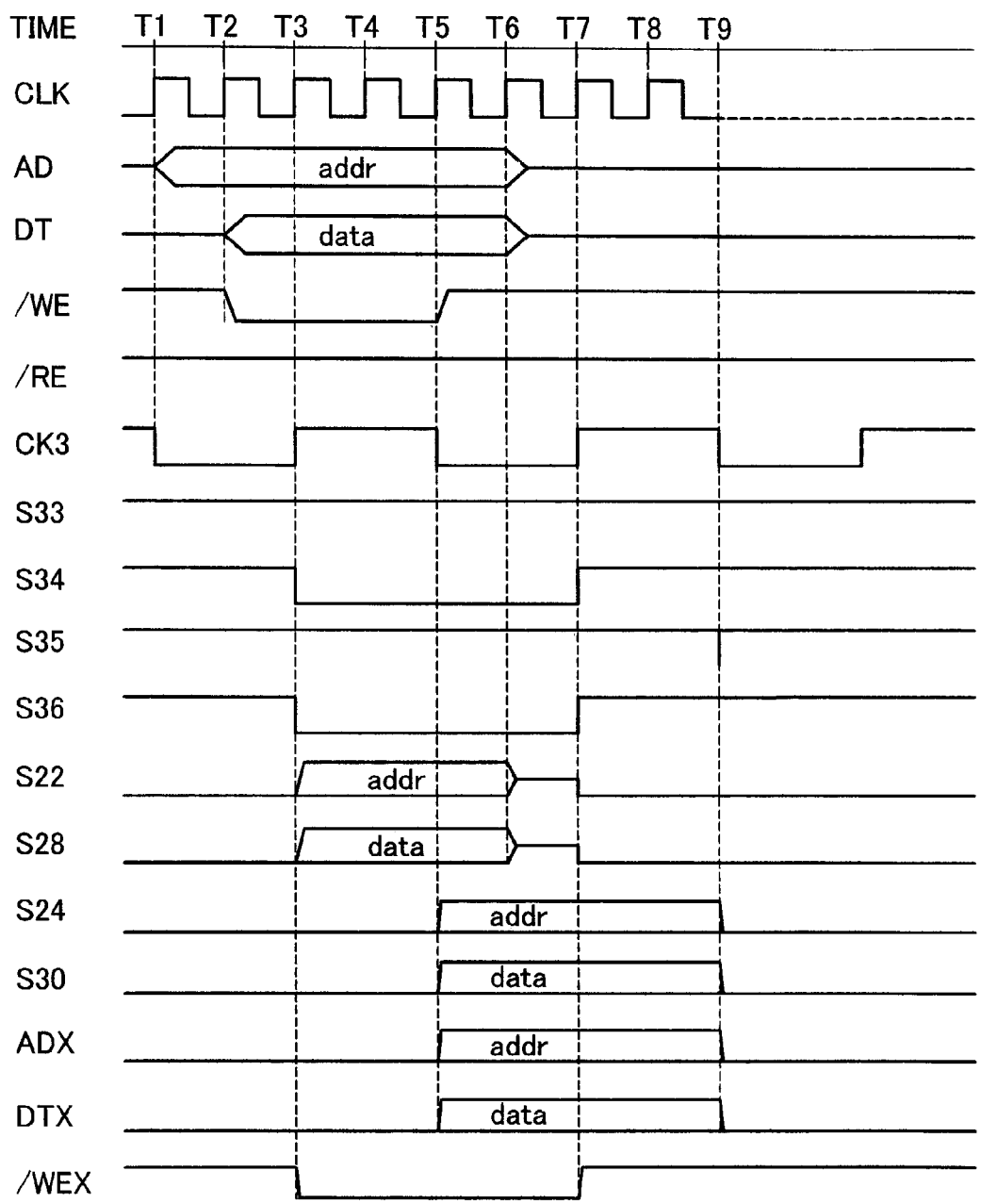

FIG. 6 is a timing chart showing the operation of the interface circuit in accordance with a frequency-divided clock signal CK3, which is turned to high at a timing of "T3". Operational timings of input signals AD, DT, /WE and /RE supplied to the input terminals 11 to 14 are the same as the above described case, shown in FIG. 4.

In the case of FIG. 6, using the frequency-divided clock signal CK3, a signal S34 supplied from the register 34 is turned to low "L" at a timing "T3" where the frequency-divided clock signal CK3 is turned to high. Each of the selectors 22 and 28 selects and connects the input terminal "A" to the output terminal "O". The selectors 22 and 28 output signals S22 and S28 as address signal "addr" and data signal "data", respectively. A signal S36 supplied from the AND gate 36 is turned to low "L", and therefore, the output terminal 18 outputs a writing control signal /WEX at a low level "L".

At a timing "T5" in which the frequency-divided clock signal CK3 is turned to low, signals S22 and S28 supplied from the selectors 22 and 28 are stored in the registers 24 and 30, respectively. The registers 24 and 30 output an address signal "addr" and a data signal "data" as signals S24 and S30, respectively.

At a timing "T7" in which the frequency-divided clock signal CK3 is turned to high, a signal S34 supplied from the register 34 is turned to high "H". A signal S36 supplied from the AND gate 36 is turned to high "H", and therefore, the output terminal 18 outputs a writing control signal /WEX at a low level "H". Each of the selectors 22 and 28 selects and connects the input terminal "B" to the output terminal "O", so that the selectors 22 and 28 output signals S22 and S28 at a low level "L".

At a timing "T9" where the frequency-divided clock signal CK3 is turned to low (falling down), the output signals S22 and S28 supplied from the selectors 22 and 28 are stored in the registers 24 and 30, respectively. The registers 24 and 30 supplies output signals of S24 and S30 of low level "L". The output terminals 16 and 17 output low level signals "L" as the address signal ADX and data signal DTX, respectively.

Figure 7:
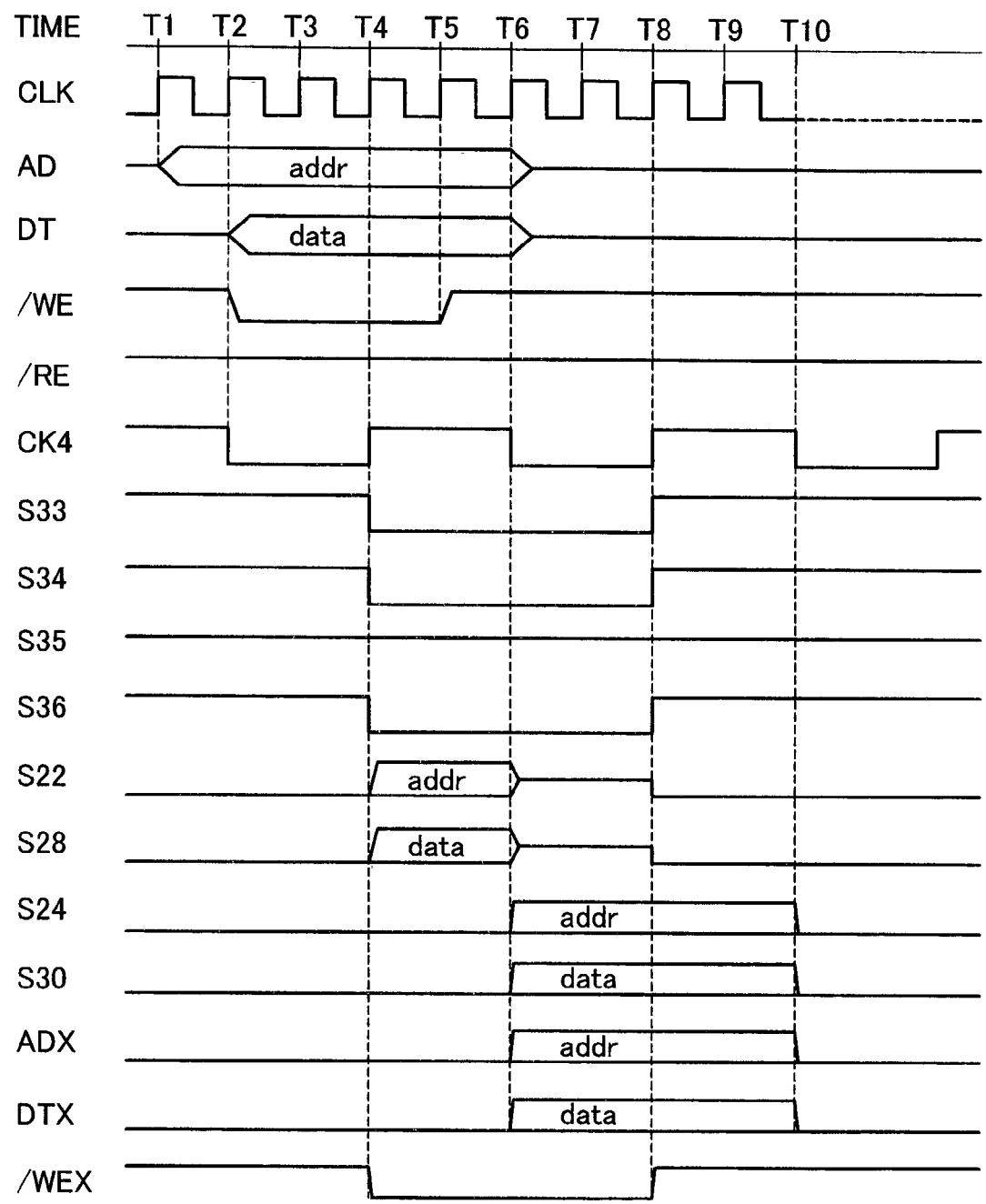

FIG. 7 is a timing chart showing the operation of the interface circuit in accordance with a frequency-divided clock signal CK4, which is turned to high at a timing of "T4". Operational timings of input signals AD, DT, /WE and /RE supplied to the input terminals 11 to 14 are the same as the above described case, shown in FIG. 4.

In the case of FIG. 7, using the frequency-divided clock signal CK4, a signal S34 supplied from the register 34 is turned to low "L" at a timing "T4" where the frequency-divided clock signal CK4 is turned to high. Each of the selectors 22 and 28 selects and connects the input terminal "A" to the output terminal "O". The selectors 22 and 28 output signals S22 and S28 as address signal "addr" and data signal "data", respectively. A signal S36 supplied from the AND gate 36 is turned to low "L", and therefore, the output terminal 18 outputs a writing control signal /WEX at a low level "L".

At a timing "T6" in which the frequency-divided clock signal CK4 is turned to low, signals S22 and S28 supplied from the selectors 22 and 28 are stored in the registers 24 and 30, respectively. The registers 24 and 30 output an address signal "addr" and a data signal "data" as signals S24 and S30, respectively.

At a timing "T8" in which the frequency-divided clock signal CK4 is turned to high, a signal S34 supplied from the register 34 is turned to high "H". A signal S36 supplied from the AND gate 36 is turned to high "H", and therefore, the output terminal 18 outputs a writing control signal /WEX at a high level "H". Each of the selectors 22 and 28 selects and connects the input terminal "B" to the output terminal "O", so that the selectors 22 and 28 output signals S22 and S28 at a low level "L".

At a timing "T10" where the frequency-divided clock signal CK4 is turned to low (falling down), the output signals S22 and S28 supplied from the selectors 22 and 28 are stored in the registers 24 and 30, respectively. The registers 24 and 30 supplies output signals of S24 and S30 of low level "L". The output terminals 16 and 17 output low level signals "L" as the address signal ADX and data signal DTX, respectively.

In a reading operation according to the interface circuit, shown in FIG. 3, a writing control signal /WE supplied to the input terminal 13 is fixed at high "H", while a low level of reading control signal /RE is supplied to the input terminal 14. Each of the selectors 26, 32 and 37 selects and connects the input terminal "B" to the output terminal "O", so that the input terminals 11 and 12 are connected to the output terminals 16 and 17, respectively. The output terminal 18 outputs a high level "H" of writing control signal /WEX.

As described above, in the interface circuit according to the present invention, the registers 23 and 29 hold and store address signal AD and data signal DT at a timing where the frequency-divided clock signal CKi is turned to high. The registers 24 and 30 hold and store address signal AD and data signal DT at a timing where the frequency-divided clock signal CKi is turned to low. Therefore, when the dividing ratio of a base clock is "N", a period of time used for turning a writing control signal /WE to low level "L" is shortened to N−1 clocks.

What is claimed is:

1. An interface circuit, comprising:
   a frequency divider which divides a frequency of a base clock to provide frequency-divided clock signals;
   a first address register which stores an address signal at a timing in which one of the frequency-divided clock signals is turned to high;
   a second address register which stores the address signal at a timing in which one of the frequency-divided clock signals is turned to low;
   a first data register which stores a data signal at a timing in which one of the frequency-divided clock signals is turned to high; and
   a second data register which stores the data signal at a timing in which one of the frequency-divided clock signals is turned to low, wherein
   the data signals stored in the first and second data registers are selectively outputted.

2. An interface circuit, comprising:
   a frequency divider which divides a frequency of a base clock to provide frequency-divided clock signals;
   a control signal generating circuit, which stores a first writing control signal supplied from a control device at both timings in which one of the frequency-divided clock signals is turned to high and low to generate first and second selecting signals and a second writing control signal, to be supplied to a controlled device;
   an address selector which selects an address signal, supplied from the control device, in accordance with the first and second selecting signals;
   an address output circuit which stores the address signal selected by the address selector at a timing in which one of the frequency-divided clock signals is turned to high or low, and supplies the stored address signal to the controlled device;

a data selector which selects a data signal, supplied from the control device, in accordance with the first and second selecting signals; and a data output circuit which stores the data signal selected by the data selector at a timing in which one of the frequency-divided clock signals is turned to high or low, and supplies the stored data signal to the controlled device.

3. An interface circuit according to claim 2, wherein the control device is a digital signal processor, and the controlled device is a large scale integrated device.

4. An interface circuit, comprising:

a frequency divider which divides a frequency of a base clock to provide frequency-divided clock signals;

a first control register which receives a first writing-control signal supplied from a control device at a timing in which one of the frequency-divided clock signals is turned to low to generate a first selecting signal;

a second control register which receives the first writing-control signal at a timing in which one of the frequency-divided clock signals is turned to high to generate a second selecting signal;

a third control register which stores the first selecting signal at a timing in which one of the frequency-divided clock signals is turned to high to generate a third selecting signal;

an AND gate which is supplied with the second and third selecting signals to generate a second writing-control signal to be supplied to a controlled device;

a first address selector which selects one of a first address signal supplied from the control device and a low level signal "L" in accordance with the first selecting signal;

a second address selector which selects one of the first address signal supplied from the control device and a low level signal "L" in accordance with the second selecting signal;

a first address register which stores a signal selected by the first address selector at a timing in which one of the frequency-divided clock signals is turned to high;

a second address register which stores a signal selected by the second address selector at a timing in which one of the frequency-divided clock signals is turned to low;

a first OR gate which receives the stored signals supplied from the first and second address registers to generate a second address signal to be supplied to the controlled device;

a first data selector which selects one of a first data signal supplied from the control device and a low level signal "L" in accordance with the first selecting signal;

a second data selector which selects one of the first data signal and a low level signal "L" in accordance with the second selecting signal;

a first data register which stores a signal selected by the first data selector at a timing in which one of the frequency-divided clock signals is turned to high;

a second data register which stores a signal selected by the second data selector at a timing in which one of the frequency-divided clock signals is turned to low; and a second OR gate which receives the stored signals supplied from the first and second data registers to generate a second data signal to be supplied to the controlled device.

5. An interface circuit according to claim 4, wherein the control device is a digital signal processor, and the controlled device is a large scale integrated device.

* * * * *